United States Patent [19]

Honma

[11] Patent Number: 5,505,627

[45] Date of Patent: Apr. 9, 1996

[54] ATTACHMENT STRUCTURE FOR COMBINER/DISTRIBUTOR FOR USE IN HIGH-FREQUENCY SIGNAL PROCESSING APPARATUS

[75] Inventor: Tomoyuki Honma, Tokyo, Japan

[73] Assignee: NEC Corporation, Tokyo, Japan

[21] Appl. No.: 243,936

[22] Filed: May 18, 1994

[30] Foreign Application Priority Data

May 20, 1993 [JP] Japan .................. 5-118384

[51] Int. Cl.$^6$ .................................. H05K 1/14
[52] U.S. Cl. .................. 439/63; 439/61; 439/573
[58] Field of Search .................. 439/63, 64, 61, 439/78, 65, 581, 544, 562, 564, 572, 573

[56] References Cited

U.S. PATENT DOCUMENTS

| | | | |
|---|---|---|---|
| 4,568,134 | 2/1986 | DiMondi | 439/62 |
| 4,703,394 | 10/1987 | Petit | 439/544 |
| 4,872,212 | 10/1989 | Roos et al. | 174/35 R |
| 4,874,318 | 10/1989 | Spencer | 439/71 |
| 5,254,016 | 10/1993 | Ganthier | 439/567 |
| 5,344,340 | 9/1994 | Bouleau | 439/63 |

FOREIGN PATENT DOCUMENTS

| | | |
|---|---|---|
| 58-166802 | 10/1983 | Japan . |
| 59-141678 | 9/1984 | Japan . |
| 63-145280 | 9/1988 | Japan . |
| 2-103872 | 4/1990 | Japan . |
| 2-80968 | 6/1990 | Japan . |
| 2-170495 | 7/1990 | Japan ............... 439/61 |
| 3-53774 | 5/1991 | Japan . |

*Primary Examiner*—Neil Abrams
*Attorney, Agent, or Firm*—Foley & Lardner

[57] ABSTRACT

A combiner/distributor (2) for relaying signals between a high-frequency signal processing apparatus and an electronic device is mounted directly on the apparatus without using connection cables. Relay coaxial connectors (22a,b,c) attached to the combiner/distributor (2) have connection ends projecting from a first principal surface (21) of the combiner/distributor (2). A back wiring board (1) has connector insertion through-holes (12) held in alignment with the coaxial connectors (22 a,b,c) on the combiner/distributor (2). The back wiring board (1) is attached to the apparatus as part of an outer wall thereof. The connection ends of the coaxial connectors (22 a,b,c) are inserted, from outside of the apparatus, into the connector insertion through-holes (12) in the back wiring board (1) such that the connection ends project into the apparatus. The projecting connection ends of the relay coaxial connectors (22a,b,c) are inserted into and project into relay connector housings (3). The combiner/distributor (2) and the connector housings (3) are fastened on the back wiring board (1). Circuit-board connector housings (30) fixed to circuit boards for processing signals in the apparatus are inserted into the relay connector housings (3) so that the relay coaxial connectors (22 a,b,c) are fittingly connected to connection coaxial connectors in the circuit-board connector housings (30).

6 Claims, 4 Drawing Sheets

ATTACHMENT STRUCTURE FOR COMBINER/DISTRIBUTOR FOR USE IN HIGH-FREQUENCY SIGNAL PROCESSING APPARATUS

BACKGROUND OF THE INVENTION

1. Field of the Invention

The present invention relates to a high-frequency signal processing apparatus, and more particularly to an attachment structure for a combiner/distributor for use in a transmitter/receiver.

2. Description of the Related Art

Structures for positioning and fixing coaxial connectors to baseboards or casings are disclosed in Japanese Patent Laid-Open No. 2-103872, Japanese Utility Model Laid-Open Nos. 59-141678, 63-145280, 2-80968, and 3-53774. However, there is nothing disclosed in these Laid-Open documents with respect to an attachment structure according to the present invention for a combiner/distributor for use in a transmitter/receiver.

Japanese Patent Laid-Open No. 58-166802 reveals a filter device comprising a filter and a distributor disposed in the casing of the filter integrally with the input/output coupling loop of a resonator of the filter. While the distributor is attached to the filter in the disclosed filter device, the distributor has to be connected through a cable to terminals mounted on an attachment plate.

FIG. 1 of the accompanying drawings shows, in exploded perspective, another conventional attachment structure for a combiner/distributor.

As shown in FIG. 1, a plurality of connector housings 106 each with a plurality of coaxial connectors 107 disposed therein are fastened by a plurality of screws 109 to an attachment surface 103 of a back wiring board (BWB) 100, which serves as a baseboard. The back wiring board 100 has a plurality of arrays of connector insertion holes 102 defined therein at the same intervals as the coaxial connectors 107, the connector insertion holes 102 in each array being aligned with the longitudinal central axis of one of signal line connectors 101. The coaxial connectors 107 have connection terminals 108 projecting through the connector insertion holes 102 into the reverse side 104 of the back wiring board 100 which is opposite to the attachment surface 103. Connector cables 110 each having coaxial connection terminals 111*a*, 111*b* on both ends are connected at one end 112 to the connection terminals 108, and at the other end 113 to a combiner/distributor 105 which is spaced from the back wiring board 100.

Since the combiner/distributor 105 is spaced from the back wiring board 100, however, attachment fixtures (not shown) are required to secure the combiner/distributor 105 in position. Because connection cables 110 with coaxial connection terminals 111*a*, 111*b* are used, it is necessary to manufacture and adjust the connection cables 110, and, as a result, the cost of the entire assembly is high due to the required expenditure of material, machining, and manufacturing expenses.

The back wiring board 100 and the combiner/distributor 105 are generally accommodated in the transmitter/receiver. As the back wiring board 100 and the combiner/distributor 105 are positioned in different locations, a large installation space is required in the transmitter/receiver, which necessarily becomes large in size. The many spots that need to be connected make the assembling process inefficient and cause a high-frequency circuit on the baseboard to have reduced reliability.

SUMMARY OF THE INVENTION

It is therefore an object of the present invention to provide an attachment structure for a combiner/distributor which allows the combiner/distributor to be mounted on a baseboard without the need for connection cables with connection terminals, resulting in a reduction in the cost, an increase in the assembling efficiency, and an improved circuit reliability.

According to the present invention, the above object can be achieved by an attachment structure for a combiner/distributor in a high-frequency signal processing apparatus for processing a high-frequency signal, the combiner/distributor including a plate-like body having first and second principal surfaces, a plurality of relay coaxial connectors mounted on the plate-like body and having first connection ends projecting from the first principal surface for interfitting connection to connection ends of a plurality of connection coaxial connectors from the high-frequency signal processing apparatus, and second connection ends of the relay coaxial connectors arranged to be connectable with signal lines of an electronic device for transmitting signals to and receiving signals from the high-frequency signal processing apparatus, the attachment structure comprising a baseboard attachable to the high-frequency signal processing apparatus as part of an outer wall thereof, the baseboard having a plurality of connection insertion through-holes in alignment with the first connection ends of the relay coaxial connectors, baseboard attaching means for attaching the baseboard to the high-frequency signal processing apparatus, and combiner/distributor attaching means for attaching the combiner/distributor to the baseboard by projecting the first connection ends of the relay coaxial connectors into the high-frequency signal processing apparatus through the connection insertion through-holes in the baseboard which is disposed in the high-frequency signal processing apparatus, so that the first connection ends of the relay coaxial connectors can be fittingly connected to the connection ends of the connection coaxial connectors.

Preferably, the relay coaxial connectors are grouped into a plurality of sets of relay coaxial connectors, the first connection ends of the relay coaxial connectors in each of the sets being linearly arrayed parallel to the connection ends of the relay coaxial connectors in the other sets, and wherein the combiner/distributor attaching means comprises a plurality of relay connector housings having connection end insertion through-holes defined in respective first longitudinal surface thereof for insertion therethrough of the first connection ends of the sets of the relay coaxial connectors, and having respective open second surfaces opposite to the first surfaces, respectively, and fastening members fastening the relay connector housings to the baseboard while holding the first longitudinal surfaces of the relay connector housings against the baseboard and fastening the combiner/distributor to the baseboard, with the first connection ends of the sets of the relay coaxial connectors being inserted through the connection end insertion through-holes so that the first connection ends of the sets of the relay coaxial connectors of the combiner/distributor mounted on the baseboard are housed in the relay connector housings, respectively.

Preferably, the fastening members comprise screws, the first longitudinal surfaces of the relay connector housings having first screw insertion through-holes defined therein as the connection end insertion through-holes, the baseboard and the combiner/distributor have second screw insertion through-holes and tapped holes defined respectively therein in registry with the first screw insertion through-holes, the screws extending through the first and second screw insertion through-holes and threaded into the tapped screws, thereby fastening the relay connector housings and the combiner/distributor to the baseboard.

Preferably, the baseboard has positioning through-holes defined therein for positioning the relay connector housings fixedly on the baseboard, the first longitudinal surfaces of the relay connector housings having positioning bosses disposed on areas thereof held against the baseboard and fitted in and temporarily secured by the positioning through-holes.

Alternatively, the baseboard has positioning bosses for positioning the relay connector housings fixedly on the baseboard, the first longitudinal surfaces of the relay connector housings having positioning holes defined in areas thereof held against the baseboard and receiving and temporarily securing the positioning bosses.

Preferably, the high-frequency signal processing apparatus has a circuit board, further including circuit-board connector housings fixedly mounted on the circuit board, the connection ends of the connection coaxial connectors being housed in the circuit-board connector housings, the circuit-board connector housings being inserted in the relay connector housings, respectively, with the connection ends of the relay coaxial connectors being fittingly connected to the connection ends of the connection coaxial connectors.

In the structure in which the positioning through-holes are defined in the baseboard, the combiner/distributor can be attached to the baseboard by first fitting the positioning bosses on the relay connector housings into the positioning holes in the baseboard to position the relay connector housings and inserting the first connection ends of the coaxial connectors which project from one surface of the combiner/distributor into the connection end insertion through-holes in the relay connector housings, thus positioning the combiner/distributor on the baseboard. Then, the screws are inserted through the first and second screw insertion through-holes in the relay connector housings and the baseboard, and threaded into the tapped holes in the combiner/distributor, thereby fastening the combiner/distributor to the baseboard. The combiner/distributor can therefore be connected directly to the baseboard without using coaxial cables.

In the structure in which the positioning bosses are disposed on the baseboard, the combiner/distributor can be attached to the baseboard by first fitting the positioning bosses on the baseboard into the positioning holes in the relay connector housings, thus positioning the relay connector housings on the baseboard. Then, the relay connector housings are fastened to the baseboard by the screws.

With the above arrangement of the present invention, the combiner/distributor can be assembled directly in the high-frequency signal processing apparatus without the need for attachment fixtures and connection cables with connection terminals which would otherwise be required in the conventional attachment structures.

Consequently, the high-frequency signal processing apparatus connected to the combiner/distributor is relatively simple in construction, cable adjustments such as cable bundling are not necessary, and the cost of manufacture including material, machining, assembling, adjusting, and parts expenses is reduced. Since no connection cables are employed, the number of connecting spots is reduced, hence the reliability of a circuit on the back wiring board is increased, and the time required to adjust the circuit can be shortened. Inasmuch as the entire arrangement is reduced in size, no large installation space is required.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 2:
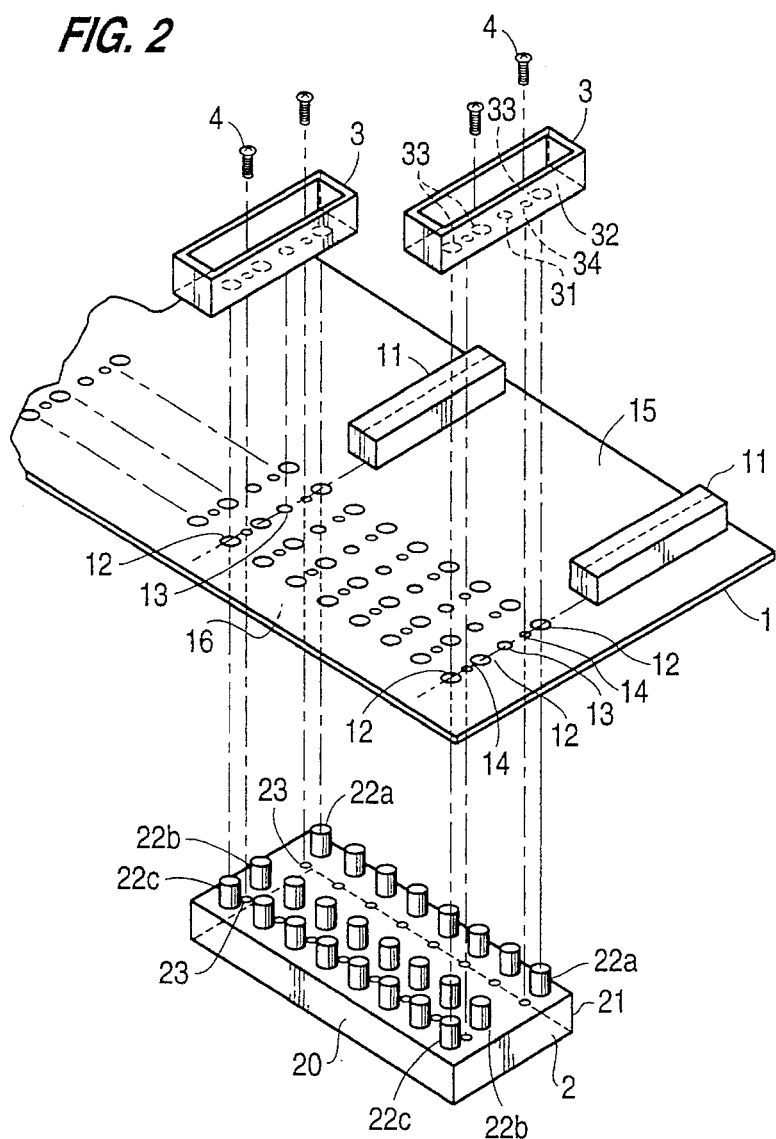
FIG. 2 is an exploded perspective view of an attachment structure for a combiner/distributor according to a first embodiment of the present invention.
Figure 2A:
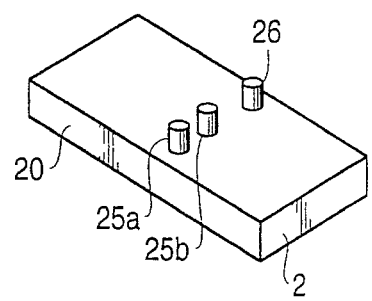
FIG. 2A is a bottom perspective view of the combiner/distributor of FIG. 2.
Figure 3:
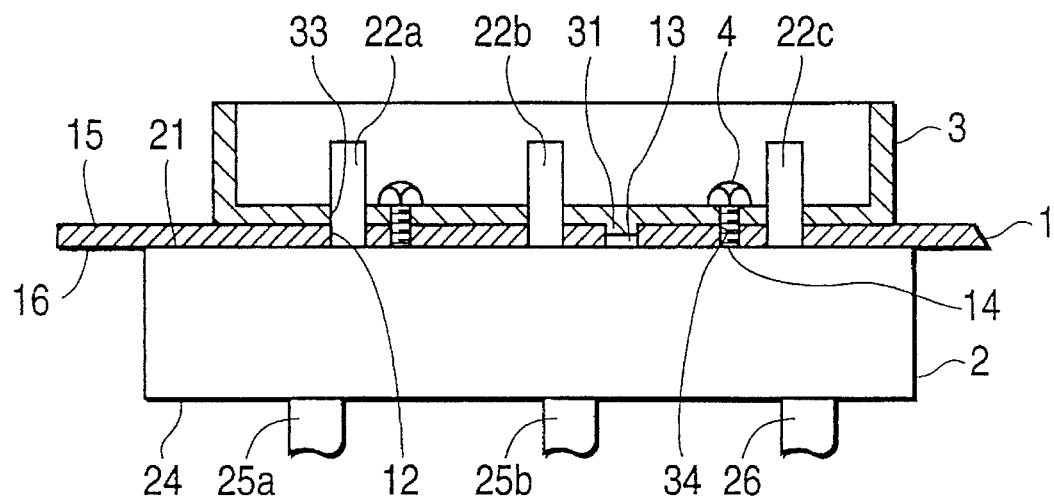
FIG. 3 is an enlarged fragmentary vertical cross-sectional view of the attachment structure with the assembled combiner/distributor.

As shown in FIGS. 2 and 3, a combiner/distributor 2 disposed in a transmitter/receiver 200 (see FIG. 4) is mounted on a back wiring board 1 which serves as a baseboard in the transmitter/receiver 200. The combiner/distributor 2 serves to combine and distribute high-frequency signals which are exchanged between a radio communication device (not shown) and the transmitter/receiver 200 through input terminals 25a, 25b and an output terminal 26 (see FIG. 3). Specifically, the combiner/distributor 2 distributes an input signal supplied from the input terminal 25a to eight relay coaxial connectors 22a, distributes an input signal supplied from the input terminal 25b to another eight coaxial connectors 22b, and combines output signals supplied to still another eight coaxial connectors 22c and outputs the combined signals to the output terminal 26.

A plurality of signal line connectors 11 (although there are actually eight signal line connectors, only two are shown for the sake of brevity) are fixedly mounted on an attachment surface 15 of the back wiring board 1 at equally spaced intervals. The back wiring board 1 has a plurality of arrays of holes defined therein, each array having three connection insertion holes 12, one circular through fitting hole 13, and two screw insertion through-holes 14 which are defined therein in alignment with the longitudinal central axis of one of the signal line connectors 11. Each of the signal line connectors 11 can be fitted in one of signal line connectors 10 (see FIG. 4) on a circuit board 201. The combiner/distributor 2 has a first principle surface 21 held against a reverse side 16 of the back wiring board 1 opposite to the attachment surface 15, the surface 21 supporting the coaxial connectors 22a, 22b, 22c thereon and having tapped holes 23 defined therein. The coaxial connectors 22a, 22b, 22c and the tapped holes 23 are arranged in a plurality of arrays aligned with the arrays of connection insertion holes 12 and screw insertion holes 14 in the back wiring board 1.

Each of a plurality of relay connector housings 3 has a cylindrical boss 31 on its surface 32 held against the back wiring board 1, the cylindrical boss 31 being fitted in one of the fitting holes 13 in the back wiring board 1. The cylindrical bosses 31 serve to position and temporarily secure the connector housings 3 on the back wiring board 1.

Each of the connector housings 3 also has three connection ends insertion through-holes 33 defined in its bottom wall in alignment with the three connector insertion holes 12 of one hole array in the back wiring board 1, and two screw insertion through-holes 34 defined in the bottom wall in alignment with the two screw insertion through-holes 14 of one hole array in the back wiring board 1. The connection end insertion through-holes 33, which are registered with the respective connector insertion holes 12, serve to guide and position the connection ends of the three coaxial connectors 22a, 22b, 22c of each connector array of the combiner/distributor 2 when the combiner/distributor 2 is assembled on the back wiring board 1.

Figure 4:
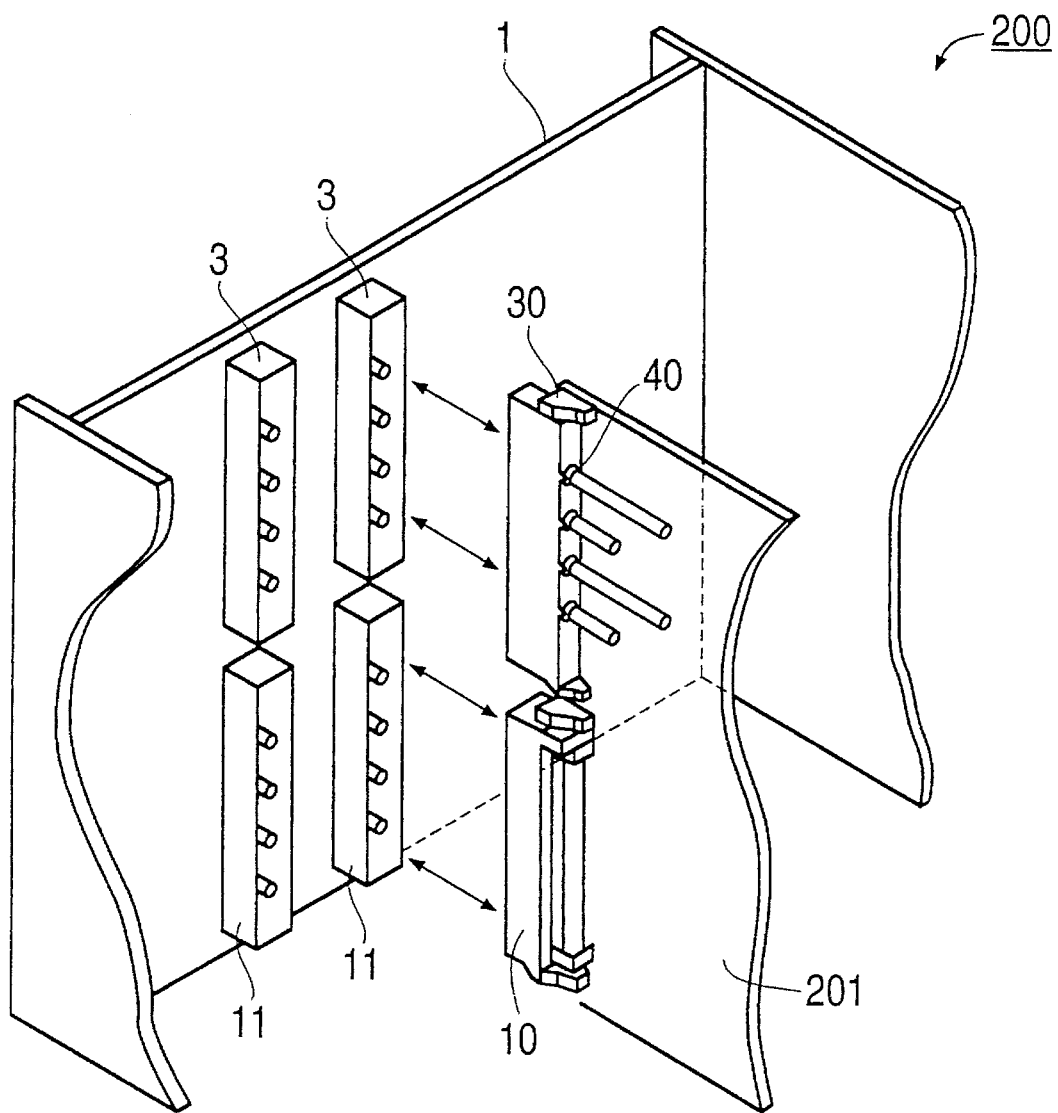
FIG. 4 is a fragmentary perspective view showing the manner in which a circuit board is connected to the assembled combiner/distributor in a transmitter/receiver.

As shown in FIG. 4, connectors 10 and connector housings 30 with built-in coaxial connectors are fixedly mounted on circuit boards 201 as a unit for the transmitter/receiver 200. The connectors 10 and the connector housings 30 are fitted in corresponding connectors 11 and connector housings 3 on the attachment surface 15 of the back wiring board 1. Signal lines from the radio communication device are connected to the reverse side 16 of the back wiring board 1.

If the connectors 10 cannot be mounted on the circuit board 20 for some reasons, the signal line connectors 11 may be dispensed with. If there is no necessity for connectors in the housings 30, the connectors housings 3 30 may be omitted.

A process of installing the combiner/distributor 2 on the back wiring board 1 will next be described.

First, the cylindrical boss 31 of each connector housing 3 is inserted from the attachment surface 15 and fitted into the corresponding fitting hole 13 in the back wiring board 1, thus positioning the connector housing 3. Then, the combiner/distributor 2 is brought toward the reverse side 16 of the back wiring board 1, and the connection ends of the coaxial connectors 22a, 22b, 22c are successively inserted into connector insertion through-holes 12 in the back wiring board 1 and the connection end insertion through-holes 33 in the connector housings 3. Finally, a plurality of sets of two screws 4 are inserted from the attachment surface 15 into the screw insertion through-holes 34, the screw insertion through-holes 14, and the tapped holes 23, thus fastening the connector housings 3 to the combiner/distributor 2 through the back wiring board 1 sandwiched therebetween.

Figure 1:
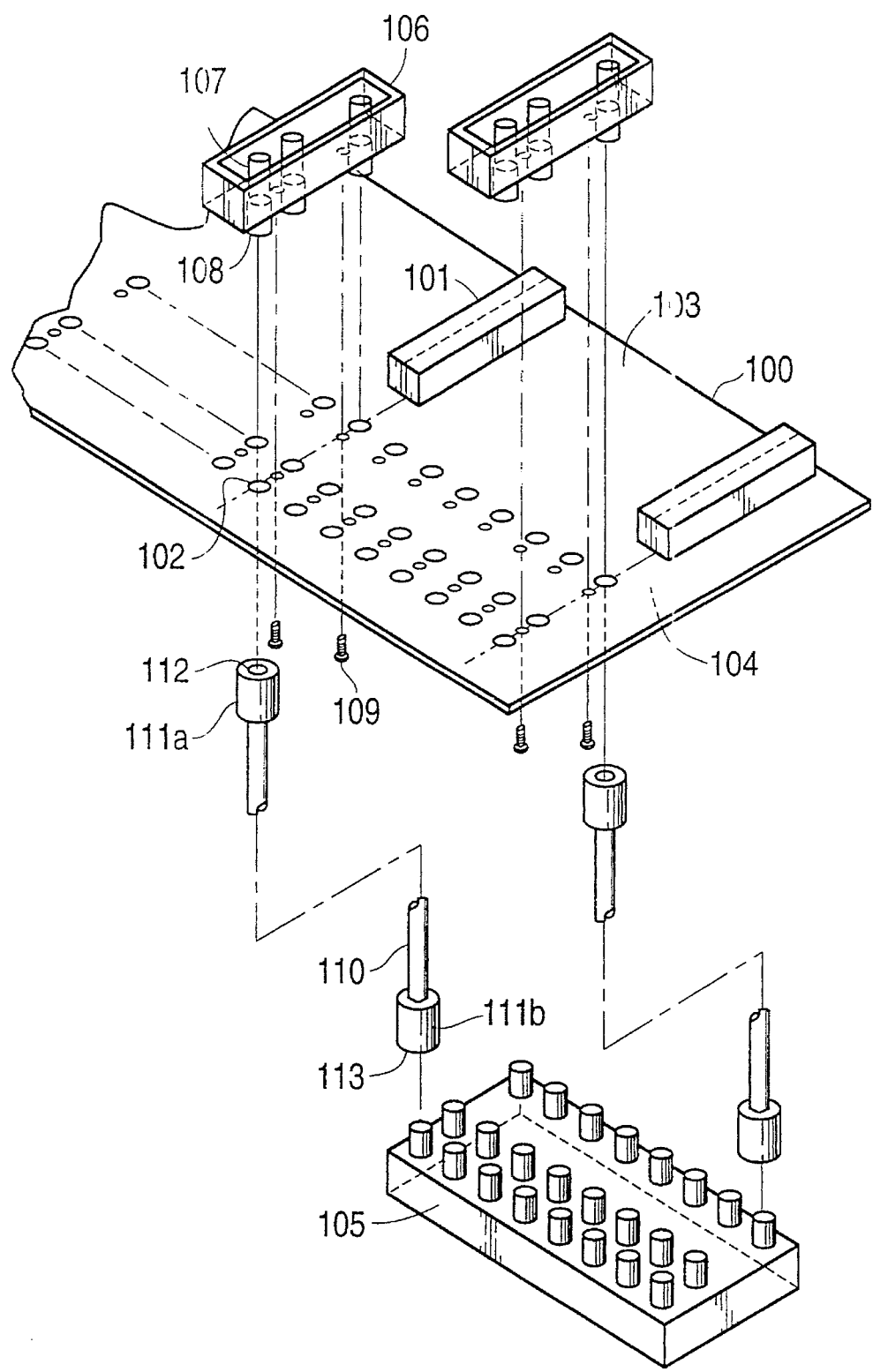
FIG. 1 is an exploded perspective view of a conventional attachment structure for a combiner/distributor.

With the attachment structure according to the above illustrated embodiment, since no attachment fixtures and no connection cables with coaxial connection terminals are required for attaching the combiner/distributor 2, unlike the conventional attachment structure shown in FIG. 1, the overall assembly is relatively simple in construction, cable adjustments such as cable bundling are not necessary, and the cost of manufacture, including material, machining, assembling, adjusting, and parts expenses, is reduced. Since the number of connecting spots is reduced, the reliability of a circuit on the back wiring board 1 is increased, and the time required to adjust the circuit can be shortened. With the combiner/distributor 2 mounted on the back wiring board 1, the entire arrangement is reduced in size, allowing itself to be easily attached to the transmitter/receiver with high efficiency, with the result that the transmitter/receiver can also be reduced in size.

An attachment structure for a combiner/distributor according to a second embodiment of the present invention will be described below with reference to FIG. 5.

Figure 5:
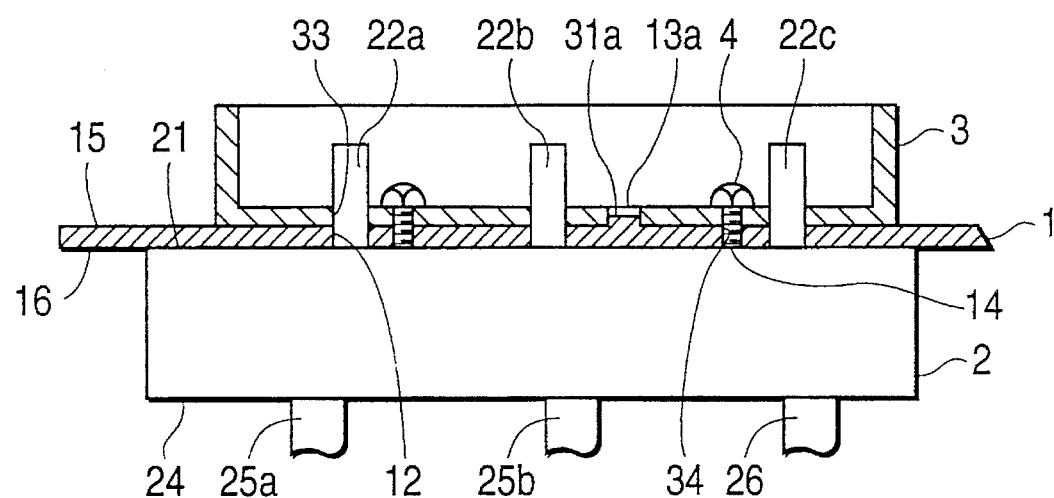
FIG. 5 is an exploded perspective view of an attachment structure for a combiner/distributor according to a second embodiment of the present invention.

As shown in FIG. 5, the attachment structure according to the second embodiment differs from the attachment structure shown in FIGS. 2 and 3 in that a back wiring board 1 has bosses 31a on the attachment surface 15, and each connector housing 3 has fitting holes 13a defined therein for receiving the bosses 31a. The other structural details of the attachment structure according to the second embodiment are the same as those of the attachment structure according to the first embodiment, and hence will not be described in detail below.

To fix the combiner 2 to the back wiring board 1, the bosses 31a on the attachment surface 15 of the back wiring board 1 are inserted and fitted into the corresponding fitting holes 13a in the connector housing 3, thus positioning the connector housings 3. Then, the combiner/distributor 2 is brought toward the reverse side 16 of the back wiring board 1, and the connection ends of the coaxial connectors 22a, 22b, 22c are successively inserted into the connector insertion through-holes 12 in the back wiring board 1 and the connection end insertion through-holes 33 in the connector housings 3. Finally, the connector housings 3 are fastened to the combiner/distributor 2 through the back wiring board 1 by a plurality of sets of two screws 4. The attachment structure according to the second embodiment offers the same advantages as those of the attachment structure according to the first embodiment.

In the above embodiments, the fitting hole, the connector insertion through-holes, and the screw insertion through-holes in each array are aligned with each other. However, these holes may be arranged in any of various other patterns. The fitting holes may be of any of various shapes other than a circular shape, and the bosses may also be of any of various shapes other than a circular shape. The fitting holes may be blind holes rather than through-holes. Each connector housing may have more than one boss or fitting hole, and may be fastened by more or less screws than two screws.

While connector housings 3 are employed in the above embodiments, connector housings 3 may be dispensed with if connections to the companion circuit board are made by other than connector housings.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A system for connecting a combiner/distributor to a high-frequency signal processing apparatus, comprising:

a plate-like body having first and second principal surfaces;

a plurality of relay coaxial connectors of said combiner/distributor mounted on said plate-like body, first connection ends of the relay coaxial connectors projecting from said first principal surface for connection with connection ends of a plurality of connection coaxial connectors from the high-frequency signal processing apparatus, and second connection ends of the relay coaxial connectors being arranged to be connected with signal lines of an electronic device for transmitting signals to and receiving signals from the high-frequency signal processing apparatus; and a baseboard affixed to the high-frequency signal processing apparatus as a part of an outer wall thereof, said baseboard having a plurality of connection insertion through-holes in alignment with the first connection ends of the relay coaxial connectors, wherein the first connection ends of the relay coaxial connectors are adapted to be fitted into the connection insertion through-holes in the baseboard so as to be connected with the connection ends of the connection coaxial connectors.

2. A system according to claim 1, wherein the relay coaxial connectors are grouped into a plurality of sets of relay coaxial connectors, the first connection ends of the relay coaxial connectors in each of the sets being linearly arrayed and parallel to the connection ends of the relay coaxial connectors in the other sets, and further comprising a plurality of relay connector housings each having connection end insertion through-holes defined in a respective first longitudinal surface thereof for receiving therein corresponding first connection ends of the relay coaxial connectors, and each having an open side opposite said first longitudinal surface, respectively, and fastening members for fastening said relay connector housings to said baseboard while holding the first longitudinal surfaces of the relay connector housings against said baseboard to fasten the combiner/distributor to said baseboard, with the first connection ends of the sets of the relay coaxial connectors being inserted through said connection end insertion through-holes so that the first connection ends of the sets of the relay coaxial connectors are held in the relay connector housings, respectively.

3. A system according to claim 2, wherein said fastening members comprise screws, said first longitudinal surfaces of said relay connector housings having first screw insertion through-holes defined therein, said baseboard having second screw insertion through-holes and said combiner/distributor having tapped holes therein, said first screw insertion through-holes being in alignment with said second screw insertion through-holes and said tapped holes, said screws extending through said first and second screw insertion through-holes and threaded into said tapped holes, thereby fastening said relay connector housings and said combiner/distributor to said baseboard.

4. A system according to claim 3, wherein said baseboard has positioning through-holes defined therein for positioning said relay connector housings correctly on said baseboard, said first longitudinal surfaces of said relay connector housings having positioning protrusions disposed on undersides thereof, said protrusions being held against said baseboard so as to be fitted into said positioning through-holes.

5. A system according to claim 3, wherein said baseboard has positioning protrusions for positioning said relay connector housings correctly on said baseboard, said first longitudinal surfaces of said relay connector housings having positioning recesses defined on undersides thereof, said recesses being held against said baseboard and receiving said positioning protrusions.

6. A system according to claim 2, wherein the high-frequency signal processing apparatus further includes circuit-board connector housings, said connection ends of the connection coaxial connectors being housed in said circuit-board connector housings, each of said circuit-board connector housings being inserted in a corresponding one of said relay connector housings, with the connection ends of the relay coaxial connectors being fitted into the connection ends of said connection coaxial connectors, respectively.

* * * * *